(12) United States Patent
Li et al.

(10) Patent No.: US 11,262,413 B2
(45) Date of Patent: Mar. 1, 2022

(54) INSULATION DETECTION CIRCUIT, DETECTION METHOD AND BATTERY MANAGEMENT SYSTEM

(71) Applicant: Contemporary Amperex Technology Co., Limited, Ningde (CN)

(72) Inventors: Meng Li, Ningde (CN); Zhimin Dan, Ningde (CN); Weiping Sun, Ningde (CN); Yizhen Hou, Ningde (CN); Wei Zhang, Ningde (CN)

(73) Assignee: Contemporary Amperex Technology Co., Limited, Ningde (CN)

(*) Notice: Subject to any disclaimer, the term of this patent is extended or adjusted under 35 U.S.C. 154(b) by 0 days.

(21) Appl. No.: 17/051,184

(22) PCT Filed: Jan. 15, 2020

(86) PCT No.: PCT/CN2020/072238
§ 371 (c)(1),
(2) Date: Oct. 28, 2020

(87) PCT Pub. No.: WO2020/147746
PCT Pub. Date: Jul. 23, 2020

(65) Prior Publication Data
US 2021/0231742 A1    Jul. 29, 2021

(30) Foreign Application Priority Data

Jan. 15, 2019  (CN) .......................... 201910037377.7

(51) Int. Cl.
*G01R 31/389*  (2019.01)
*G01R 31/364*  (2019.01)
*G01R 31/36*  (2020.01)

(52) U.S. Cl.
CPC ......... *G01R 31/389* (2019.01); *G01R 31/364* (2019.01); *G01R 31/3644* (2013.01)

(58) Field of Classification Search
None
See application file for complete search history.

(56) References Cited

U.S. PATENT DOCUMENTS

| | | | | |
|---|---|---|---|---|
| 5,818,236 A | * | 10/1998 | Sone ...................... | G01R 31/52 324/509 |
| 2011/0115490 A1 | * | 5/2011 | Klijn .................... | G01R 27/025 324/430 |

(Continued)

FOREIGN PATENT DOCUMENTS

| | | |
|---|---|---|
| CN | 102539917 A | 7/2012 |
| CN | 102749562 A | 10/2012 |

(Continued)

OTHER PUBLICATIONS

Concise Explanation of Relevance for CN OA1, dated Aug. 10, 2020, 10 pages.

(Continued)

*Primary Examiner* — Nasima Monsur
(74) *Attorney, Agent, or Firm* — Law Offices of Liaoteng Wang

(57) ABSTRACT

The present application provides an insulation detection circuit, a method and a battery management system. The circuit includes: a first voltage dividing module, where, one end of the first voltage dividing module is connected to a positive electrode of a power battery to be detected, and the other end of the first voltage dividing module is connected to a first isolation module and a second voltage dividing module respectively; the second voltage dividing module, connected to a negative electrode of the power battery to be detected; the first isolation module, connected to one end of a sampling module; the sampling module, where, the other end of the sampling module is connected to one end of a signal generating module; the signal generating module, (Continued)

where, the other end of the signal generating module is connected to power ground; and the processing module.

13 Claims, 3 Drawing Sheets

(56) References Cited

U.S. PATENT DOCUMENTS

| | | | | |
|---|---|---|---|---|
| 2015/0043117 A1* | 2/2015 | Xiang | ................ | H02J 7/00308 |
| | | | | 361/91.5 |
| 2016/0329115 A1* | 11/2016 | Han | .................... | G21C 17/102 |
| 2018/0017609 A1* | 1/2018 | Terada | ..................... | H02H 3/04 |
| 2019/0011504 A1* | 1/2019 | Kim | ....................... | G01R 27/14 |
| 2019/0235013 A1 | 8/2019 | Zhang et al. | | |

FOREIGN PATENT DOCUMENTS

| | | |
|---|---|---|
| CN | 104076254 A | 10/2014 |
| CN | 106324462 A | 1/2017 |
| CN | 206235668 U | 6/2017 |
| CN | 206292308 U | 6/2017 |
| CN | 107064638 A | 8/2017 |
| CN | 107727934 A | 2/2018 |
| CN | 108037366 A | 5/2018 |
| CN | 108196176 A | 6/2018 |
| CN | 108333492 A | 7/2018 |
| CN | 108445397 A | 8/2018 |
| CN | 108680793 A | 10/2018 |
| CN | 108802494 A | 11/2018 |
| DE | 3346387 A1 | 7/1985 |
| EP | 0913697 A2 | 5/1999 |
| JP | 2007187454 A | 7/2007 |
| KR | 101619477 B1 | 5/2016 |

OTHER PUBLICATIONS

The International search report for PCT Application No. PCT/CN2020/072238, dated Apr. 20, 2020, 13 pages.
The extended European search report for EP Application No. 20740929.3, dated Jun. 14, 2021, 8 pages.

* cited by examiner

INSULATION DETECTION CIRCUIT, DETECTION METHOD AND BATTERY MANAGEMENT SYSTEM

CROSS-REFERENCE TO RELATED APPLICATIONS

This application is a National Stage of International Application No. PCT/CN2020/072238, filed on Jan. 15, 2020, which claims priority to Chinese Patent Application No. 201910037377.7, filed on Jan. 15, 2019, both of which are hereby incorporated by reference in their entireties.

TECHNICAL FIELD

The present application relates to the field of new energy, in particular, to an insulation detection circuit, a detection method and a battery management system.

BACKGROUND

The use of electric vehicles to replace fossil-fueled vehicles has become a trend in the development of the automotive industry. The mileage, service life, and safety of use of battery packs are particularly important for electric vehicles. The battery pack is one of key parts of an electric vehicle, the safety of high-voltage electricity of the battery pack must be put into one of the first considerations of a power battery system. Therefore, the detection of insulation performance of the electric vehicle is an essential part of the design.

Currently, the main methods for detecting insulation resistance include high-frequency signal injection method and resistance voltage division method. When a detection system using the high-frequency injection method is adopted, the detection result of the insulation resistance value is likely to be affected by the distributed capacitance of the detection system, and the high-frequency signal causes interference to the direct current system, which results in a large error in the insulation resistance value. When the resistance voltage division method is adopted, the resistors connected in series reduce the insulation performance, and the high-voltage circuit will cause interference to the low-voltage circuit, which would also reduce the detection precision of the insulation resistance value. Therefore, improving the detection precision of the insulation resistance value is an urgent problem to be solved.

SUMMARY

Embodiments of the present application provide an insulation detection circuit, a detection method and a battery management system, which improve the detection precision of the insulation resistance value.

According to an aspect of the embodiments of the present application, an insulation detection circuit is provided, where the circuit includes:

a first voltage dividing module, where, one end of the first voltage dividing module is connected to a positive electrode of a power battery to be detected, and the other end of the first voltage dividing module is connected to a first isolation module and a second voltage dividing module respectively;

the second voltage dividing module, connected to a negative electrode of the power battery to be detected;

the first isolation module, connected to one end of a sampling module;

the sampling module, where, the other end of the sampling module is connected to one end of a signal generating module;

the signal generating module, where, the other end of the signal generating module is connected to power ground, and the signal generating module is configured to inject a signal at a predetermined frequency into the power battery to be detected; and a processing module, configured to calculate an insulation resistance value of the power battery to be detected, according to a first sampled signal collected at the one end of the sampling module and a second sampled signal collected at the one end of the signal generating module.

In an embodiment, the first voltage dividing module includes a first resistor, where one end of the first resistor is connected to the positive electrode, and the other end of the first resistor is connected to the first isolation module and the second voltage dividing module respectively.

In an embodiment, the second voltage dividing module includes:

a second resistor, where, one end of the second resistor is connected to the other end of the first resistor, and the other end of the second resistor is connected to a first switch; and the first switch, connected to the negative electrode.

In an embodiment, a resistance value of the first resistor is equal to a resistance value of the second resistor.

In an embodiment, the first isolation module includes:

a second switch, connected to the other end of the first voltage dividing module; and an isolation capacitor, connected to the second switch and the sampling module respectively.

In an embodiment, the sampling module includes a third resistor, which is connected to the first isolation module and the signal generating module respectively.

In an embodiment, the signal generating module is a DDS waveform generator.

In an embodiment, a value of the predetermined frequency ranges from 0.1 Hz to 10 Hz.

In an embodiment, the circuit further includes:

a first sampling circuit, where, a first end of the first sampling circuit is connected to the one end of the sampling module, a second end of the first sampling circuit is connected to the processing module, and the first sampling circuit is configured to collect the first sampled signal from the one end of the sampling module.

In an embodiment, the circuit further includes:

a first filtering module, connected to the one end of the sampling module and a second insolation module respectively;

the second insolation module, connected to the first sampling circuit, and the second insolation module is configured to isolate interference of the first sampling circuit on the first sampled signal.

In an embodiment, the second insolation module includes:

a first voltage follower, where, a first input end of the first voltage follower is connected to the first filtering module, and an output end of the first voltage follower is connected to a second input end of the first voltage follower and the first sampling circuit respectively.

In an embodiment, the circuit further includes:

a second sampling circuit, where a first end of the second sampling circuit is connected to the one end of the signal generating module, the second end of the second sampling circuit is connected to the processing module, and the second sampling circuit is configured to collect the second sampled signal from the one end of the signal generating module.

In an embodiment, the circuit further includes:

a second filtering module, connected to the one end of the signal generating module and a third isolation module respectively;

the third isolation module, connected to the second sampling circuit, and the third isolation module is configured to isolate interference of the second sampling circuit on the second sampled signal.

In an embodiment, the third isolation module includes:

a second voltage follower, where, a first input end of the second voltage follower is connected to the second filtering module, and an output end of the second voltage follower is connected to a second input end of the second voltage follower and the second sampling circuit respectively.

According to another aspect of the embodiments of the present application, a battery management system is provided, where the battery management system includes the insulation detection circuit according to the embodiments of the present application.

According to yet another aspect of the embodiments of the present application, an insulation detection method is provided, where the method is applied to the insulation detection circuit according to the embodiments of the present application and the method includes:

calculating the insulation resistance value of the power battery to be detected according to the first sampled signal and the second sampled signal.

In an embodiment, the calculating the insulation resistance value of the power battery to be detected according to the first sampled signal and the second sampled signal includes:

acquiring a first voltage amplitude value of the first sampled signal and a second voltage amplitude value of the second sampled signal;

calculating a phase shift of the first sampled signal relative to the second sampled signal according to the first voltage amplitude value and the second voltage amplitude value; and calculating the insulation resistance value of the power battery to be detected based on the phase shift, the first voltage amplitude value, the predetermined frequency and the second voltage amplitude value.

According to the insulation detection circuit, the method and the battery management system provided by the embodiments of the present application, the signal at the predetermined frequency is injected between the first voltage dividing module and the second voltage dividing module, which reduces the influence of the voltage fluctuation of the power battery on the signal between the sampling module and the first isolation module, thereby improving the accuracy and precision of the detection of the insulation resistance value.

BRIEF DESCRIPTION OF THE DRAWINGS

The features, advantages, and technical effects of the exemplary embodiments of the present application will be described below with reference to the accompanying drawings.

DESCRIPTION OF EXAMPLE CONFIGURATIONS

Implementations of the present application are described in further detail below with reference to the accompanying drawings and embodiments. The detailed description and accompanying drawings of the following embodiments are used to exemplarily illustrate the principle of the present application, but they cannot be used to limit the scope of the present application, that is, the present application is not limited to the described embodiments.

It is to be noted that relational terms such as first, second and the like are used herein only to distinguish an entity or operation from another entity or operation without requiring or implying that there is any such actual relationship or order between these entities or operations. Moreover, the term "comprise", "include" or any other variant thereof is intended to encompass a non-exclusive inclusion, such that a process, method, article or device that includes a series of elements includes not only these elements but also other elements that are not explicitly listed or those elements that are inherent to such a process, method, article or device. In the absence of more restrictions, elements defined by the statement "includes . . . " do not preclude the presence of additional identical elements in the process, method, article or device that includes the elements.

It should be noted that, the power battery to be detected in the embodiments of the present application may be a lithium ion battery, a lithium metal battery, a lead-acid battery, a nickel-cadmium battery, a nickel hydrogen battery, a lithium sulfur battery, a lithium air battery, or a sodium ion battery, which will not be limited herein. In terms of scale, the power battery to be detected may also be a battery cell unit, or a battery module or a battery pack, which will not be limited herein.

In the following, the insulation detection circuit according to the embodiments of the present application will be described in detail in connection with the accompanying drawings.

Figure 1:
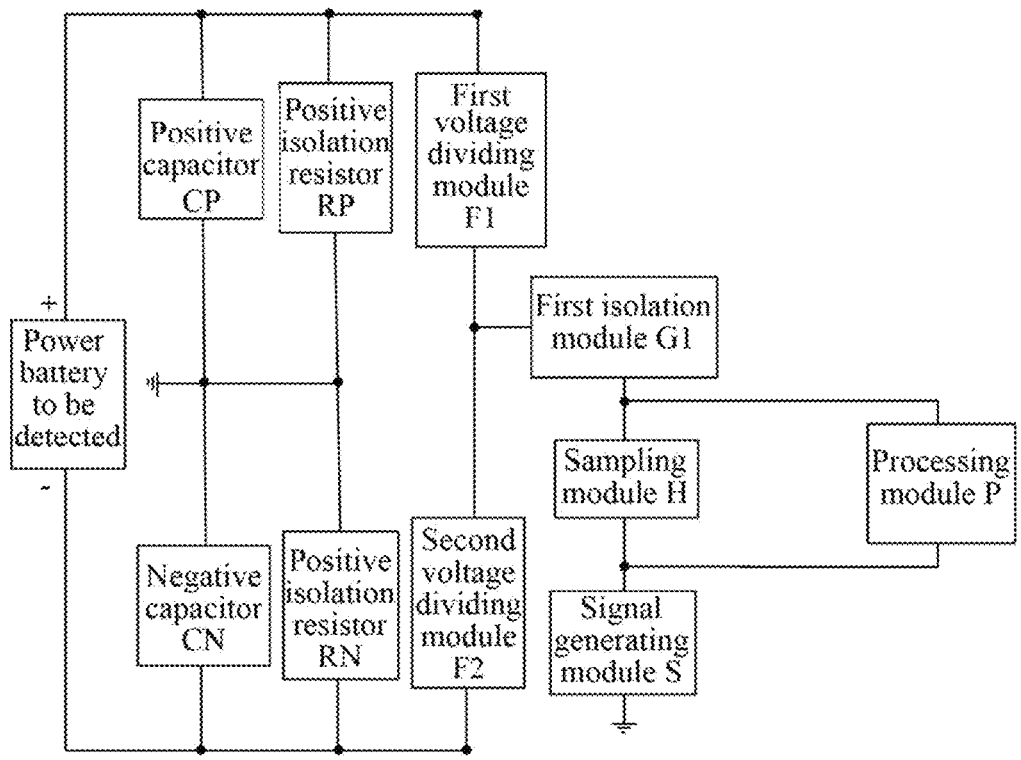
FIG. 1 shows a schematic structural diagram of an insulation detection circuit according to some embodiments of the present application.

FIG. 1 shows a schematic structural diagram of an insulation detection circuit according to some embodiments of the present application. As shown in FIG. 1, the insulation detection circuit includes:

a first voltage dividing module F1, where, one end of the first voltage dividing module F1 is connected to a positive electrode of a power battery to be detected, and the other end of the first voltage dividing module F1 is connected to a first isolation module G1 and a second voltage dividing module F2 respectively;

the second voltage dividing module F2, connected to a negative electrode of the power battery to be detected;

the first isolation module G1, connected to one end of a sampling module H;

the sampling module H, where, the other end of the sampling module H is connected to one end of a signal generating module S;

the signal generating module S, where, the other end of the signal generating module S is connected to power ground, and the signal generating module S is configured to inject a signal at a predetermined frequency into the power battery to be detected; and a processing module P, configured to calculate an insulation resistance value of the power battery to be detected according to a first sampled signal collected from the one end of the sampling module H and a second sampled signal collected from the one end of the signal generating module S.

FIG. 1 further shows a positive capacitor CP, a negative capacitor CN, a positive insulation resistor RP, and a negative insulation resistor RN of the power battery to be detected.

It should be understood that, the positive capacitor CP and the negative capacitor CN are equivalent capacitors of the power battery to be detected relative to the low-voltage ground. The positive insulation resistor RP is an insulation resistor of the positive electrode of the battery to be detected relative to the low-voltage ground, and the negative insulation resistance RN is an insulation resistance of the negative electrode of the power battery relative to the low-voltage ground.

In the embodiment of the present application, a first voltage signal between the sampling module H and the first isolation module G1 may be collected from the one end of the sampling module H, and a second voltage signal injected by the signal generating module S may be collected from the one end of the signal generating module S. Since the voltage signal between the sampling module H and the first isolation module G1 will be affected by the insulation resistance value of the power battery to be detected, based on Kirchhoff's law, the insulation resistance value of the power battery to be detected may be calculated according to the first voltage signal and the second voltage signal.

In the embodiment of the present application, the signal at the predetermined frequency is injected between the first voltage dividing module F1 and the second voltage dividing F2 module, which reduces the influence of the voltage fluctuation of the power battery to be detected on the signal between the sampling module H and the first isolation module G1, thereby improving the accuracy and precision of the detection of the insulation resistance value.

In addition, the first isolation module G1 in the embodiment of the present application may be an isolation capacitor. The signal at the predetermined frequency is injected between the first voltage dividing module F1 and the second voltage dividing module F2 and directly connecting the isolation capacitor to the power battery to be detected is avoided, which solves the problem of the selection of isolation capacitor brought by the voltage withstand level and effectively improves the voltage withstand level of insulation detection.

In some embodiments, the signal generating module S may be a direct digital frequency synthesis (DDS) waveform generator. The frequency stability and accuracy of the signal generated by the DDS waveform generator can reach the same level as the reference frequency, and it can be fine-tuned in frequency over a wide frequency range. The signal source designed using this manner can operate in the modulation state, can adjust the output level, and can output various types of waveform, for example, a sine wave, a triangle wave, a square wave, and the like.

In some embodiment, the value of the predetermined frequency of the signal generated by the DDS waveform generator ranges from 0.1 Hz to 10 Hz. By injecting a low-frequency signal generated by the DDS waveform generator between the first voltage dividing module F1 and the second voltage dividing module F2, the interference of the high-frequency signal on the insulation detection is avoided, and the stability of the insulation detection is improved.

Figure 2:
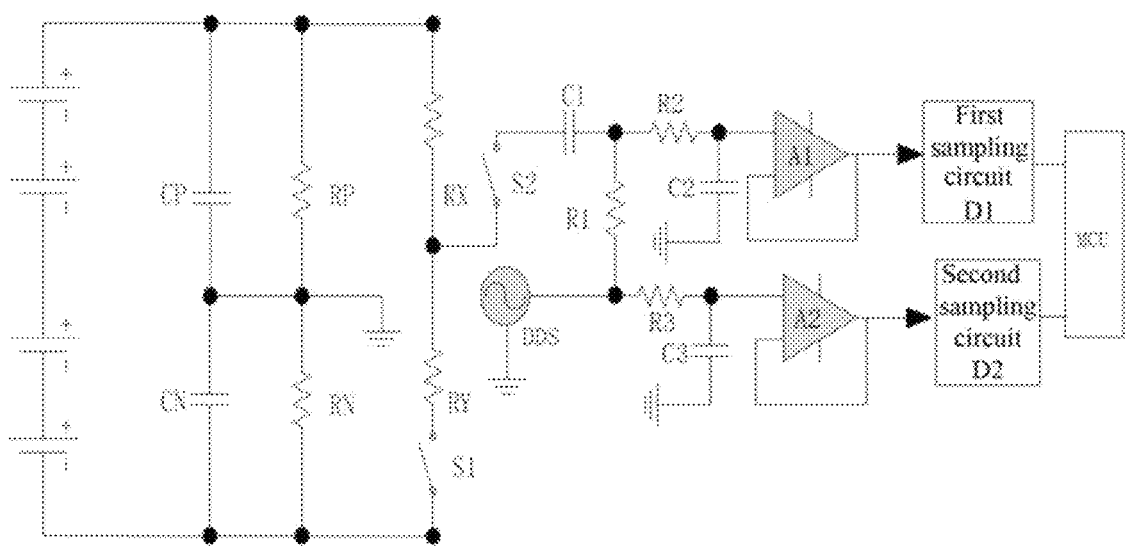
FIG. 2 shows a schematic structural diagram of an insulation detection circuit according to some other embodiments of the present application.

FIG. 2 shows a schematic structural diagram of an insulation detection circuit according to some other embodiments of the present application. FIG. 2 shows the component composition of some of the modules in FIG. 1.

The first voltage dividing module F1 may include a resistor RX, the second voltage dividing module F2 may include a resistor RY and a switch S1, and the first isolation module G1 includes a switch S2 and an isolation capacitor C1.

One end of the resistor RX is connected to the positive electrode of the power battery to be detected, and the other end of the resistor RX is connected to one end of the resistor RY and one end of the switch S2 respectively. The other end of the switch S2 is connected to one end of the isolation capacitor C1.

The other end of the resistor RY is connected to one end of the switch S1, and the other end of the switch S1 is connected to the negative electrode of the power battery to be detected. The switch S1 and the switch S2 may be optical metal oxide semiconductor (MOS) field effect transistors. The switch S1 and the switch S2 may also be regular switches.

Still referring to FIG. 2, the sampling module H includes a sampling resistor R1, and the signal generating module S includes a DDS waveform generator. The other end of the isolation capacitor C1 is connected to one end of the sampling resistor R1, and the other end of the sampling resistor R1 is connected to the DDS waveform generator. Also, the DDS waveform generator is connected to the power ground.

In this embodiment, the signal generating module S is directly connected to the power ground, and there is no need to isolate the signal generating module S, which reduces the cost. In addition, the reference ground of the processing module P is also the power ground, i.e., the earth. Therefore, the processing module P can directly process the collected signal, which shortens the detection time and reduces the cost.

In this embodiment, the low-frequency signal is injected between the resistor RX and the resistor RY, which avoids the influence of the voltage fluctuation of the power battery to be detected on the signal between the isolation capacitor C1 and the sampling resistor R1, thereby improving the detection precision of the insulation resistance.

In some embodiments, the resistance value of the resistor RX is equal to the resistance value of the resistor RY. During the insulation detection, the switch S1 and the switch S2 need to be closed. Because the connection position of the high voltage side of the isolation capacitor C1 is at an equivalent electric potential of the voltage at the actual intermediate voltage position of the power battery to be detected, by this manner, the problem of injecting a low frequency alternating current signal into the actual intermediate voltage cell caused by the technology difficulty is solved. At the same time, the branch where the resistor RX is located can be used as a high-voltage sampling circuit for collecting the voltage of the power battery to be detected, which saves the cost.

In this embodiment, the isolation capacitor C1 can isolate the high-voltage sampled signal from the low-voltage sampled signal on the side of the power battery to be detected, which avoids the interference of the high-voltage signal on the low-voltage signal, improving the stability of insulation detection.

In the embodiment of the present application, the processing module P can directly collect the first voltage signal from the common end of the sampling resistor R1 and the isolation capacitor C1, and directly collect the second voltage signal from the signal generating module S, or the collection can also be performed through a dedicated sampling circuit.

Referring to FIG. 2, the insulation detection circuit further includes a first sampling circuit D1 and a second sampling circuit D2.

In some embodiments, a first end of the first sampling circuit D1 is connected to one end of the sampling resistor R1, and a second end of the first sampling circuit D1 is connected to a processing module P. The first sampling circuit D1 is configured to collect a voltage signal between the sampling resistor R1 and the isolation capacitor C1 from the one end of the sampling resistor R1.

A first end of the second sampling circuit D2 is connected to one end of a signal generating module S, a second end of the second sampling circuit D2 is connected to the processing module P, and the second sampling circuit D2 is configured to collect a voltage signal generated by a DDS signal generator from one end of a signal generating module S.

The processing module P may be a microcontroller unit (MCU), which is configured to receive a first sampled signal from the first sampling circuit, receive a second sampled signal from the second sampling circuit, and calculate an insulation resistance value according to the first sampled signal and the second sampled signal.

Figure 3:
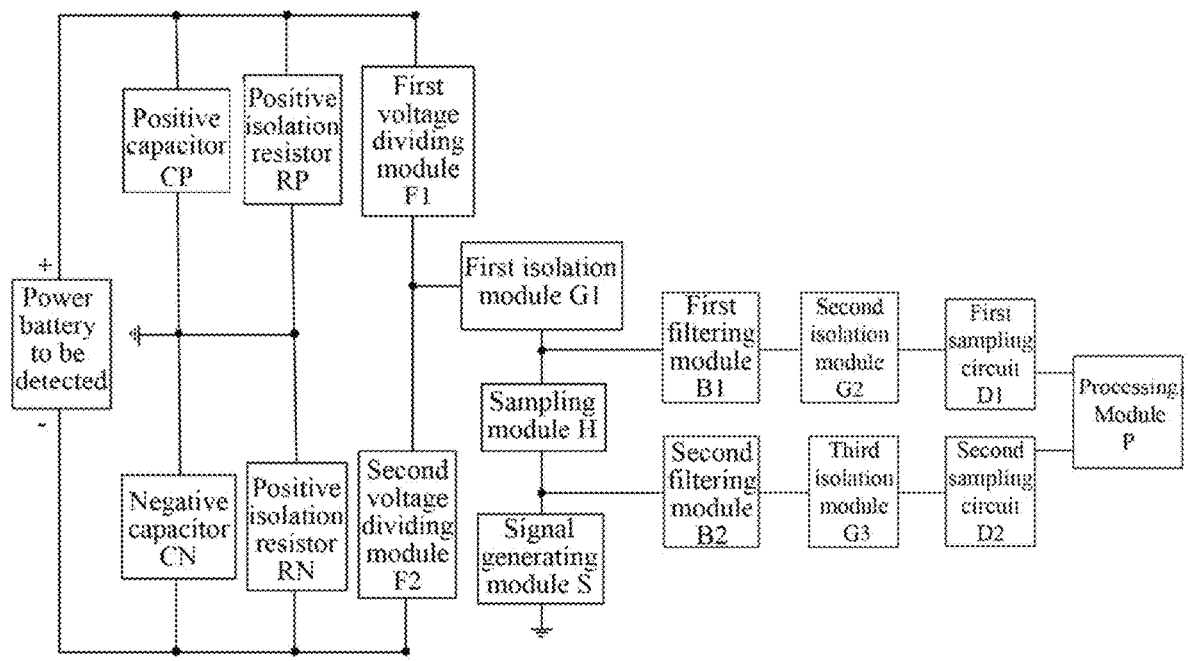
FIG. 3 shows a schematic structural diagram of an insulation detection circuit according to some other embodiments of the present application.

FIG. 3 shows another schematic structural diagram of an insulation detection circuit according to some other embodiments of the present application. FIG. 3 is different from FIG. 1 in that FIG. 3 further includes: a first filtering module B1, a second isolation module G2, a second filtering module B2, a third isolation module G3, a first sampling circuit D1, and a second collecting circuit C2.

The first filtering module B1 is connected to the one end of the sampling module H and a second insolation module G2 respectively. The second isolation module G2 is connected to the first sampling circuit D1. The second isolation module G2 is configured to isolate the interference of the first sampling circuit D1 on the signal between the sampling module H and the first isolation module G1.

Referring to FIG. 2, in some examples, the first filtering module B1 includes a resistor R2 and a capacitor C2. The second isolation module G2 includes a first voltage follower A1.

One end of the resistor R2 is connected to the one end of the sampling resistor R1, and the other end of the resistor R2 is connected to one end of the capacitor C2 and a first input end of the first voltage follower A1 respectively. The other end of the capacitor C2 is connected to the power ground.

A second input end of the first voltage follower A1 is connected to an output end of the first voltage follower A1, and the output end of the first voltage follower A1 is connected to the first sampling circuit D1.

The first filtering module B1 filters the signal between the first isolation module G1 and the sampling module H, which can suppress noise and prevent interference, improving the sampling precision of the signal between the first isolation module G1 and the sampling module H. Thus, the detection precision of the insulation resistance value is improved.

The first sampling circuit D1 and the second sampling circuit D2 may each include a resistor voltage divider and an MCU. The voltage of the sine wave outputted by the DDS waveform generator is relatively high and exceeds the sampling range of the MCU in the first sampling circuit and the MCU in the second sampling circuit, therefore, the voltage signal between the sampling module H and the first isolation module G1 needs to be voltage divided by the resistor voltage divider before the sampling. The insulation resistance value is generally large, and direct applying the resistance voltage division will cause current division, which makes the sampling of the voltage signal between the sampling module H and the first isolation module G1 inaccurate, therefore, adding the voltage follower can increase the input impedance and prevent the influence of the first sampling circuit D1 on the sampled signal. Moreover, the voltage follower can also play a role of further filtering.

The second filtering module B2 is connected to the one end of the signal generating module S and a third isolation module G3 respectively. The third isolation module G3 is connected to the second sampling circuit D2, and the third isolation module G3 is configured to isolate the interference of the second sampling circuit D2 on the signal generated by the DDS waveform generator.

Referring to FIG. 2, in some examples, the second filtering module B2 includes a resistor R3 and a capacitor C3. The third isolation module G3 includes a second voltage follower A2.

One end of the resistor R3 is connected to the DDS waveform generator, and the other end of the resistor R3 is connected to one end of the capacitor C3 and a first input end of the second voltage follower A2 respectively. The other end of the capacitor C3 is connected to the power ground.

A second input end of the second voltage follower A2 is connected to an output end of the second voltage follower A2, and the output end of the second voltage follower A2 is connected to the second sampling circuit D2.

The second filtering module B2 filters the signals generated by the DDS waveform generator, which can suppress noise and prevent interference, improving the sampling precision of the signal generated by the DDS waveform generator, thus, the detection precision of the insulation resistance value is further improved.

The function of the second voltage follower A2 is similar to that of the first voltage follower A1, which will not be repeated here.

The embodiments of the present application also provide a battery management system, which includes the insulation detection circuit as described above.

In the embodiment of the present application, based on the insulation detection circuit discussed above, the insulation resistance value of the power battery to be detected may be calculated according to the first sampled signal between the sampling module H and the first isolation module G1 and the second sampled signal generated by the signal generating module S. The calculation process of the insulation resistance value of the power battery to be detected based on the insulation detection circuit discussed above according to the embodiment of the present application is described in detail below.

Figure 4:
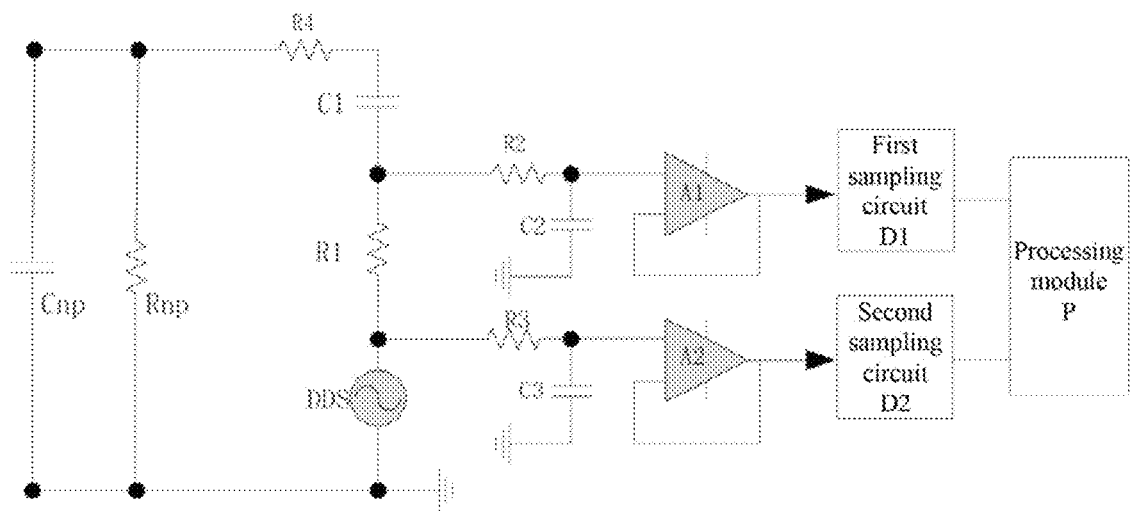
FIG. 4 is an equivalent circuit diagram of an insulation detection circuit corresponding to FIG. 2.

Referring to FIG. 4, since the internal resistance of the power battery to be detected is very small, the direct current power supply can be considered as equivalently short-circuited, that is, FIG. 2 is considered as equivalent to FIG. 4.

In FIG. 4, Rnp is a resistance value of the positive insulation resistor RP and the negative insulation resistor RN connected in parallel, that is, Rnp=RP/RN, and Cnp is a capacitance value of the positive capacitor CP and the negative capacitor CN connected in parallel, that is, Cnp=CN/CP, and the equivalent insulation resistance value Rnp is smaller than RN and RP. In the embodiment of the present application, the insulation resistance value Rnp may be used as a standard for measuring the insulation performance. R4 is a resistance value of the resistor RX and the resistor RY connected in parallel, that is, R4=RX/RY.

It is assumed that, in FIG. 2, the equivalent impedance of Cnp and Rnp is Z, based on Kirchhoff's law and the formula of a resistor and a capacitor connected in parallel, the expression thereof can be obtained as:

$$Z = \frac{Rnp}{w^2 \cdot Cnp^2 \cdot Rnp^2 + 1} - \frac{w \cdot Cnp \cdot Rnp^2}{w^2 \cdot Cnp^2 \cdot Rnp^2 + 1} \cdot j \quad (1)$$

Where w is an angular frequency of the voltage signal generated by the signal generating module S, and j is a symbol of the imaginary part.

It is assumed that Z1 is a total impedance of Cnp, Rnp, C1, and R4, and θ is a phase shift of the signal between the isolation capacitor C1 and the sampling resistor R1 with regard to the signal outputted by the DDS waveform generator. Based on Kirchhoff's law, the following expression may be obtained:

$$\frac{U}{u\cos(\theta) + u\sin(\theta) \cdot j} = \frac{Z1 + R1}{Z1} \quad (2)$$

Where U is an amplitude value of the voltage signal generated by the DDS signal generator, u is an amplitude value of the voltage signal between the isolation capacitor C1 and the sampling resistor R1, and U and u are sine wave signals of a same frequency.

The relationship between Z1 and Z can be expressed by the following expression:

$$Z = Z1 - \frac{1}{j \cdot w \cdot C1} - R4 \quad (3)$$

If the voltage signal between the isolation capacitor C1 and the sampling resistor R1 is expressed in phasor method as:

$$u = u \times \cos(\theta) + u \times \sin(\theta) \times j \quad (4)$$

to eliminate the phase shift θ, the phase shift θ may be converted into an expression of a measurable value.

For example, it is assumed that the expression of an instantaneous voltage UA of the voltage signal generated by the signal generating module S over time is:

$$UA = U \times \sin(w \times t) + M \quad (5)$$

It can be assumed that an instantaneous voltage UB of the voltage signal between the isolation capacitor C1 and the sampling resistor R1 at the same time is expressed as:

$$UB = u \times \sin(w \times t + \theta) + M \quad (6)$$

Where M is a bias voltage and t is the time. In order to improve the calculation precision of the insulation resistance value, a first transient voltage of the first sampled signal where the waveform is at the rising edge and a second transient voltage of the second sampled signal where the waveform is at the rising edge at the same time may be respectively obtained as UB and UA.

Combining formula (4) to formula (6), the calculation formula of the phase shift θ is obtained as:

$$\theta = \arcsin\left(\frac{UB - M}{u}\right) - \arcsin\left(\frac{UA - M}{U}\right) \quad (7)$$

The simultaneous formula (2) and formula (3) are simplified as:

$$Z = \frac{U \cdot u \cdot R1 \cdot \cos(\theta) - u^2 \cdot R1}{U^2 - 2U \cdot u \cdot \cos(\theta) + u^2} - \\ R4 + \left(\frac{U \cdot u \cdot R1 \cdot \sin(\theta)}{U^2 - 2U \cdot u \cdot \cos(\theta) + u^2} + \frac{1}{w \cdot C1}\right) \cdot j \quad (8)$$

Then, the simultaneous formula (1) and formula (8) may be simplified and solved to obtain the calculation formula of Rnp.

Therefore, for the calculation of the value of Rnp (i.e., the insulation resistance value), it only needs to measure the amplitude value of the signal outputted by the DDS waveform generator, the amplitude value of the signal between the isolation capacitor C1 and the sampling resistor R1, and the phase shift of the signal between the isolation capacitor C1 and the sampling resistor R1 with regard to the signal outputted by the DDS waveform generator.

Figure 5:
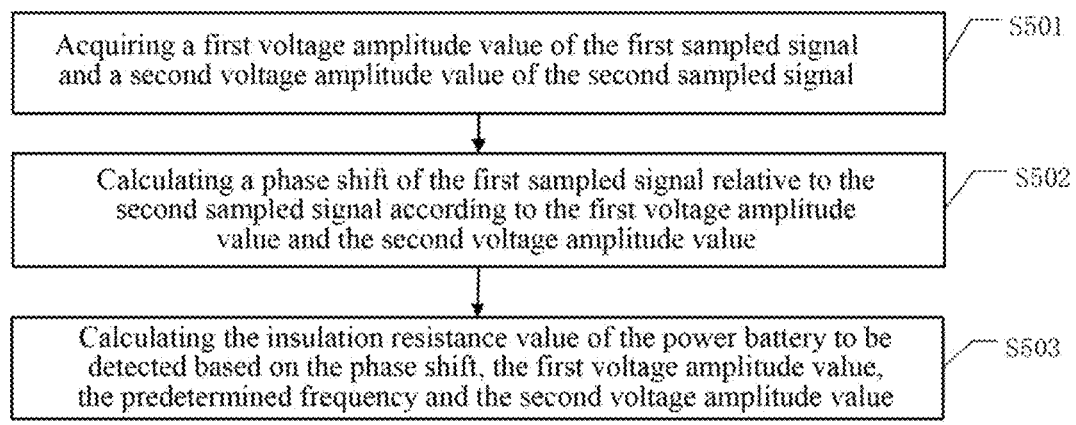
FIG. 5 is a schematic flowchart of an insulation detection method according to some embodiments of the present application.

FIG. 5 is a schematic flowchart of an insulation detection method according to some embodiments of the present application, which is applied to the insulation detection circuit as shown in FIG. 1 to FIG. 3. The insulation detection method according to the embodiment of the present embodiment includes the following steps:

S501: acquiring a first voltage amplitude value of the first sampled signal and a second voltage amplitude value of the second sampled signal.

Referring to FIG. 2, before step S501, if insulation resistance value detection is to be performed, the switch S1 and the switch S2 are closed first to power on the insulation detection circuit.

Then, the first voltage amplitude value u of the first sampled signal, the second voltage amplitude value U of the second sampled signal and the bias voltage M are acquired, and the first transient voltage UB of the first sampled signal and the second transient voltage UA of the second sampled signal at the same time are acquired.

The first sampled signal is the signal between the first isolation module G1 and the sampling module H. The second sampled signal is the signal generated by the DDS waveform generator.

S502: calculating a phase shift of the first sampled signal relative to the second sampled signal according to the first voltage amplitude value and the second voltage amplitude value.

Specifically, the above-mentioned UA, UB, M, U, and u are substituted into the formula (7) to obtain the phase shift θ.

S503: calculating the insulation resistance value of the power battery to be detected based on the phase shift, the first voltage amplitude value, the predetermined frequency and the second voltage amplitude value.

Specifically, the insulation resistance value of the power battery to be detected may be calculated according to the phase shift, the first voltage amplitude value, the second voltage amplitude value, the predetermined frequency ω, the resistance value of RX, the resistance value of RY, the capacitance value of C1, and the resistance value of R1 in combination with the formula (1) and the formula (8).

Although the present application has been described with reference to the preferred embodiments, various modifications may be made thereto and components thereof may be replaced with equivalents without departing from the scope of the present application. In particular, as long as there is no structural conflict, the technical features mentioned in the embodiments can be combined in any manner. The present application is not limited to the specific embodiments disclosed herein, instead, it includes all technical solutions that fall within the scope of the claims.

What is claimed is:

1. An insulation detection circuit, comprising:
a first voltage dividing module, wherein, one end of the first voltage dividing module is connected to a positive electrode of a power battery to be detected, and the other end of the first voltage dividing module is connected to a first isolation module and a second voltage dividing module respectively;
the second voltage dividing module, connected to a negative electrode of the power battery to be detected;
the first isolation module, connected to one end of a sampling module;
the sampling module, wherein, the other end of the sampling module is connected to one end of a signal generator;
the signal generator, wherein, the other end of the signal generator is connected to power ground, and the signal generator is configured to inject a signal at a predetermined frequency to the power battery to be detected; and
a processor, configured to calculate an insulation resistance value of the power battery to be detected according to a first sampled signal collected at the one end of the sampling module and a second sampled signal collected at the one end of the signal generator,
wherein the first voltage dividing module comprises a first resistor, one end of the first resistor is connected to the positive electrode, and the other end of the first resistor is connected to the first isolation module and the second voltage dividing module respectively;
the second voltage dividing module comprises: a second resistor, one end of the second resistor being connected to the other end of the first resistor, and the other end of the second resistor being connected to a first switch; and the first switch, connected to the negative electrode;
a resistance value of the first resistor is equal to a resistance value of the second resistor; and
the first isolation module comprises: a second switch, connected to the other end of the first voltage dividing module; and an isolation capacitor, connected to the second switch and the sampling module respectively.

2. The circuit according to claim 1, wherein, the sampling module comprises a third resistor, wherein, the third resistor is connected to the first isolation module and the signal generator respectively.

3. The circuit according to claim 1, wherein, the signal generator is a direct digital frequency synthesis (DDS) waveform generator.

4. The circuit according to claim 1, wherein, a value of the predetermined frequency ranges from 0.1 Hz to 10 Hz.

5. The circuit according to claim 1, wherein, the circuit further comprises:

a first sampling circuit, wherein, a first end of the first sampling circuit is connected to the one end of the sampling module, a second end of the first sampling circuit is connected to the processor, and the first sampling circuit is configured to collect the first sampled signal at the one end of the sampling module.

6. The circuit according to claim 5, wherein, the circuit further comprises:
a first filtering module, connected to the one end of the sampling module and a second isolation module respectively;
the second isolation module, connected to the first sampling circuit and configured to isolate interference of the first sampling circuit on the first sampled signal.

7. The circuit according to claim 6, wherein, the second isolation module comprises:
a first voltage follower, wherein, a first input end of the first voltage follower is connected to the first filtering module, and an output end of the first voltage follower is connected to a second input end of the first voltage follower and the first sampling circuit respectively.

8. The circuit according to claim 1, wherein, the circuit further comprises:
a second sampling circuit, wherein, a first end of the second sampling circuit is connected to the one end of the signal generator, a second end of the second sampling circuit is connected to the processor, and the second sampling circuit is configured to collect the second sampled signal at the one end of the signal generator.

9. The circuit according to claim 8, wherein, the circuit further comprises:
a second filtering module, connected to the one end of the signal generator and a third isolation module respectively;
the third isolation module, connected to the second sampling circuit and configured to isolate interference of the second sampling circuit on the second sampled signal.

10. The circuit according to claim 9, wherein, the third isolation module comprises:
a second voltage follower, wherein, a first input end of the second voltage follower is connected to the second filtering module, and an output end of the second voltage follower is connected to a second input end of the second voltage follower and the second sampling circuit respectively.

11. A battery management system, comprising the insulation detection circuit according to claim 1.

12. An insulation detection method, applied to the insulation detection circuit according to claim 1, wherein, the method comprises:
calculating the insulation resistance value of the power battery to be detected according to the first sampled signal and the second sampled signal.

13. The method according to claim 12, wherein, the calculating the insulation resistance value of the power battery to be detected according to the first sampled signal and the second sampled signal comprises:
acquiring a first voltage amplitude value of the first sampled signal and a second voltage amplitude value of the second sampled signal;
calculating a phase shift of the first sampled signal relative to the second sampled signal according to the first voltage amplitude value and the second voltage amplitude value; and calculating the insulation resistance value of the power battery to be detected based on the phase shift, the first voltage amplitude value, the predetermined frequency and the second voltage amplitude value.

* * * * *